(12) United States Patent
Bortnyanskiy

(10) Patent No.: US 10,768,134 B2
(45) Date of Patent: Sep. 8, 2020

(54) DEVICE FOR DETERMINING THE PARAMETERS OF STRIP-TYPE SUPERCONDUCTORS

(71) Applicant: STATE ATOMIC ENERGY CORPORATION "ROSATOM" ON BEHALF OF THE RUSSIAN FEDERATION, Moscow (RU)

(72) Inventor: Arnol'd Leonidovich Bortnyanskiy, St. Petersburg (RU)

(73) Assignee: STATE ATOMIC ENERGY CORPORATION "ROSATOM" ON BEHALF OF THE RUSSIAN FEDERATION, Moscow (RU)

( * ) Notice: Subject to any disclaimer, the term of this patent is extended or adjusted under 35 U.S.C. 154(b) by 0 days.

(21) Appl. No.: 16/315,950

(22) PCT Filed: Jul. 7, 2017

(86) PCT No.: PCT/RU2017/000501
§ 371 (c)(1),
(2) Date: Jan. 7, 2019

(87) PCT Pub. No.: WO2018/009102
PCT Pub. Date: Jan. 11, 2018

(65) Prior Publication Data
US 2019/0145921 A1    May 16, 2019

(30) Foreign Application Priority Data
Jul. 7, 2016 (RU) .................. 2016127480

(51) Int. Cl.
G01N 27/14    (2006.01)
H01F 6/06    (2006.01)
(Continued)

(52) U.S. Cl.
CPC ............... *G01N 27/14* (2013.01); *H01F 6/06* (2013.01); *H01L 39/00* (2013.01); *H02H 9/023* (2013.01)

(58) Field of Classification Search
CPC ........... G01N 27/14; H01F 6/06; H01L 39/00; H02H 9/023
(Continued)

(56) References Cited

U.S. PATENT DOCUMENTS 5,015,952 A * 5/1991 Doss .................... G01N 27/023
324/236
5,134,360 A    7/1992 Martin et al.
(Continued)

FOREIGN PATENT DOCUMENTS

JP    H06117943 A    4/1994
RU    2034286 C1    4/1995
(Continued)

OTHER PUBLICATIONS

Written Opinion of corresponding PCT/RU2017/000501 application dated Nov. 23, 2017, 7 pages.
(Continued)

*Primary Examiner* — Farhana A Hoque
(74) *Attorney, Agent, or Firm* — Brooks Kushman P.C.

(57) ABSTRACT

A device for determining the parameters of strip-type superconductors includes a generator, a generator frequency-setting element, an inductance coil connected to the generator, a receiver, a receiver frequency-setting element, and an inductance coil connected to the receiver. The generator and receiver frequency-setting elements are same type narrow-band elements. The pass bands of the generator and receiver frequency-setting elements coincide through at least half of the bandwidth of the frequency-setting element having a narrower band pass width. The generator and receiver induc-
(Continued)

tance coils are arranged with a gap between the same, making it possible for a strip-type superconductor to be placed between the inductance coils. The device is provided with a temperature sensor comprising a thermistor in contact with the superconductor. The device enables highly accurate and reproducible measurement results.

5 Claims, 2 Drawing Sheets

(51) Int. Cl.
*H01L 39/00* (2006.01)
*H02H 9/02* (2006.01)

(58) Field of Classification Search
USPC .................................................. 324/236, 691
See application file for complete search history.

(56) References Cited

U.S. PATENT DOCUMENTS

2002/0024404 A1* 2/2002 Fuke ..................... H01P 1/2135
333/99 S
2012/0286779 A1* 11/2012 Walsh .................... G01R 33/44
324/309

FOREIGN PATENT DOCUMENTS

RU 2556273 C2 7/2015
WO 2018009102 A1 1/2018

OTHER PUBLICATIONS

International Search Report of corresponding PCT/RU2017/000501 application dated Nov. 23, 2017, 4 pages.
International Preliminary Report on Patentability of corresponding PCT/RU2017/000501 application dated Jan. 8, 2019, 4 pages.
King, Frank, Finding the critical temperature of a YBCO superconductor using a voltage probe, Physics Department, The College of Wooster, May 8, 2008, retrieved from the Internet <URL:http://physics.wooster.edu/JrIS/Files/King_web_article.pdf>, 4 pages.
Brown, Daniel et al., MillimanMeasuring the Critical Temperature of YBCO using Meissner effect, Department of Physics, Wabash College,Dec. 10, 2008, retrieved from the internet <URL: http://www.iontrap.wabash.edu/adlab/papers/F2008_brown_milliman_superconductor_transition.pdf>, 3 pages.

* cited by examiner

DEVICE FOR DETERMINING THE PARAMETERS OF STRIP-TYPE SUPERCONDUCTORS

CROSS-REFERENCE TO RELATED APPLICATION

This application is the U.S. national phase of PCT Application No. PCT/RU2017/000501 filed on Jul. 7,2017, which claims priority to RU Patent Application No. 2016127480 filed on Jul. 7, 2016, the disclosures of which are incorporated in their entirety by reference herein.

TECHNICAL FIELD

The invention relates to the study and analysis of materials using electrical and magnetic instruments and can be used to determine or control the physical properties of superconductors.

PRIOR ART

There is known a device for controlling the properties of superconductors (Finding the critical temperature of a YBCO superconductor using a voltage probe, Frank King. Physics Department, The College of Wooster, Wooster, Ohio 44691, USA. Dated: May 8, 2008). The prior art device measures the superconductor resistance according to a four-point pattern. Two current measuring wires and two voltage measuring wires are connected to the superconductor. The wires are connected to a complicated multichannel device, for example, Keithly 2000. In addition, the prior art device for measuring the superconductor temperature uses a thermocouple having its warm thermal junction placed in a vessel with a mixture of water and ice and its cold thermal junction in contact with the superconductor. The thermocouple has one end connected to one of the channels of Keithly 2000 multichannel device. The prior art process for controlling the superconductor parameters comprises immersing the sample under study in liquid nitrogen together with the wires connected thereto. The superconductor and wire temperature decreases too fast and unevenly due to a difference in the physical characteristics of the sample and wires so that no detailed curve of superconducting transition can be obtained, i.e. the measurement accuracy and reproducibility are limited. In particular, the measurement accuracy of the superconducting transition temperature is ±1.1 K, being insufficient in a number of cases.

There is also known a device for controlling the superconductor parameters (Measuring the Critical Temperature of YBCO using Meissner effect, Daniel Brown and Mihach Milliman, Department of Physics, Wabash College, Crawfordsville, Ind. 47933. Dated: Dec. 10, 2008). Such device for measuring and controlling the superconductor parameters allows only a critical temperature to be measured, i.e. its functionality is limited. The use of such device also requires that the superconductor should be immersed in liquid nitrogen together with the coils, which also limits the measurement accuracy like in the device discussed above. In addition, a feedback between the generator and the amplifier is provided in the prior art device for maintaining the measurement system in the resonant state, which requires further adjustments impairing the accuracy and reproducibility of measurement results and complicating the process of operating the device on the whole. Moreover, a thermocouple is used in the prior art device in the process of temperature measurements. The sensitivity of thermocouples is known to decrease dramatically in the low-temperature region, which further impairs the measurement accuracy.

SUMMARY OF THE INVENTION

It is an object of the present invention to improve the accuracy of determining and controlling the parameters of strip-type superconductors, as well as to improve the reproducibility of measurement results while simplifying the operation of the device.

The above problem is solved by means of a device for determining the parameters of strip-type superconductors, comprising a generator having a generator frequency-setting element and a generator inductance coil (i.e. connected to the generator), and a receiver having a receiver frequency-setting element and a receiver inductance coil (i.e. connected to the receiver), wherein the generator and receiver inductance coils are arranged with a gap between the same, making it possible for a strip-type superconductor to be placed between the inductance coils, and the pass/stop bands of the generator and receiver frequency-setting elements coincide through at least half of the pass/stop bands of the frequency-setting element having a narrower pass/stop band width.

In a preferred embodiment, the generator and receiver frequency-setting elements comprise narrow-band elements. The band centers of the pass/stop bands of the generator and receiver frequency-setting elements are preferably frequency spaced by not more than 10% (preferably by not more than 1%) of the pass/stop band width of the frequency-setting element having a narrower pass band width. In another embodiment, the band centers of the pass/stop bands of the generator and receiver frequency-setting elements are frequency spaced by a value in the range of 1% to 10% or in the range of 0.5% to 1% of the pass/stop band width of the frequency-setting element having a narrower pass band width.

In a preferred embodiment, the generator and receiver frequency-setting elements comprise same type elements. In addition, the amplifying elements forming part of the generator and receiver may also comprise same type elements. The generator and receiver frequency-setting elements may have characteristics (in particular, frequency or other characteristics, for example, electrical, mechanical, technical and the like) differing by not more than 10% or 1%. In another embodiment, the generator and receiver frequency-setting elements have characteristics differing by a value in the relative range of 1% to 10% or in the relative range of 0.5% to 1%.

The problem of the invention is also solved by that in any of the above embodiments, the above discussed device for determining the parameters of strip-type superconductors may be used as part of a measurement system for determining the parameters of strip-type superconductors, said system comprising, in addition to said device, a temperature measurement device including a temperature sensor. The device may also have a reservoir containing a cryogenic agent. In such system, the inductance coils of the device for determining the parameters of strip-type superconductors and the temperature sensor may be arranged in the reservoir containing the cryogenic agent.

In a preferred embodiment, the temperature measurement device comprises a thermistor configured to be in contact with the strip-type superconductor. The temperature measurement device may also have a current stabilizer and a millivoltmeter. The current stabilizer may be provided on the basis of a precision stabilitron with a source follower in the anode circuit. The inductance coils are arranged at a distance of substantially at least 30 mm above the cryogenic agent surface.

The generator inductance coil may be referred to as a primary inductance coil and may be connected to the generator output (or the output of the amplifier forming part of the generator). The receiver inductance coil may be referred to as a secondary inductance coil and may be connected to the input of the amplifier forming part of the receiver.

The frequency-setting elements may comprise suppression and/or transmission (depending on the circuit diagram) preferably narrow-band filters with identical, slightly different electrical characteristics, included in the feedback circuits of the generator and receiver amplifying elements. A current stabilizer may be provided on the basis of a precision stabilitron having the stabilization accuracy, for example, of ±0.001 and a source follower in the anode circuit.

The inputs of an electronic device used as an amplifying element in the generator are advantageously earthed and the inverting input is further provided with a resistor to control the output voltage amplitude.

In a preferred embodiment of the device for determining (controlling) the parameters of superconductors, the inductance coils are configured to have identical electrical parameters and identical electronic devices provided with feedback circuits having identical narrow-band suppression/transmission filters are used as the generator and receiver amplifiers. By means of such circuit diagram, the generator-receiver system is constantly maintained in the resonant state, which is accompanied by a reduction in the noise signal level, i.e. the measurement accuracy of the magnetic susceptibility of the sample under study is improved.

Unlike the prototype, the electric circuit of the proposed device has no feedback for maintaining the system in the resonant state. However, since the amplifier circuit diagram and the generator circuit diagram provide for narrow-band suppression/transmission filters with identical electrical characteristics (or those enabling the generator and amplifier frequency bands coinciding by at least 50% through the narrowest of the bandwidths), the generator and the receiver operate at the same frequency, i.e. the system is in the resonant state in the absence of feedback.

The inductance coils are arranged in the reservoir with the cryogenic agent at a distance of substantially at least 30 mm above the cryogenic agent surface. If the inductance coils and the sample under study are arranged at a distance of less than 30 mm above the cryogenic agent surface, the sample will alternate between the superconducting state and the normal state due to exposure to strong convective streams of cryogenic agent vapors, in particular liquid nitrogen close to its surface. This phenomenon negatively affects both the accuracy of measurements being performed and the reproducibility of the obtained measurement results.

At a greater distance between the sample under study and the cryogenic agent surface (for example, more than 40 mm or more than 50 mm or more than 60 mm), the measurement time becomes unreasonably high. In particular, is has been found out experimentally using the device under discussion that a 25-mm increase in the distance results in a 6% increase in the measurement time.

A thermistor connected to the current stabilizer and a millivoltmeter may be used in the proposed device as a temperature sensing device in contact with the superconductor.

The thermistor current stabilizer may be provided on the basis of a precision stabilitron with a source follower in the anode circuit. The stabilitron voltage is maintained stable with a high degree of accuracy because the current flowing through the source follower does not virtually change due to the feedback. Therefore, highly stable thermistor current is enabled and, hence, high accuracy and reproducibility of the obtained measurement results.

The electronic device used as the generator amplifier may have its inputs earthed and the inverting input is further provided with a resistor to control the output voltage amplitude. Such connection of the amplifying electronic device allows the same to be used as a generator. The resistor provided at the inverting input allows the required generator output voltage amplitude to be enabled because heating of the superconductor may occur at high values of generator amplitude, causing superconductivity to disappear.

Therefore, one circuit is intended for measuring magnetic susceptibility while the other one is intended for measuring temperature at the same time. As measurements are performed for a certain period of time, a relationship between magnetic susceptibility and, time and a relationship between temperature and time may be obtained. Therefore, a relationship between magnetic susceptibility and temperature may be obtained. The obtained data allows a number of parameters to be determined at once with a high accuracy, in particular critical temperature and width of the superconducting transition of the superconductor under study. In addition, the proposed device requires no setups and adjustments due to the use of components setting the measurement parameters defined during assembly of the device. Thus, the proposed device is far easier to operate than the prior art devices.

BRIEF DESCRIPTION OF THE DRAWINGS

The invention is explained by the drawings wherein.

EMBODIMENT OF THE INVENTION

Figure 1:
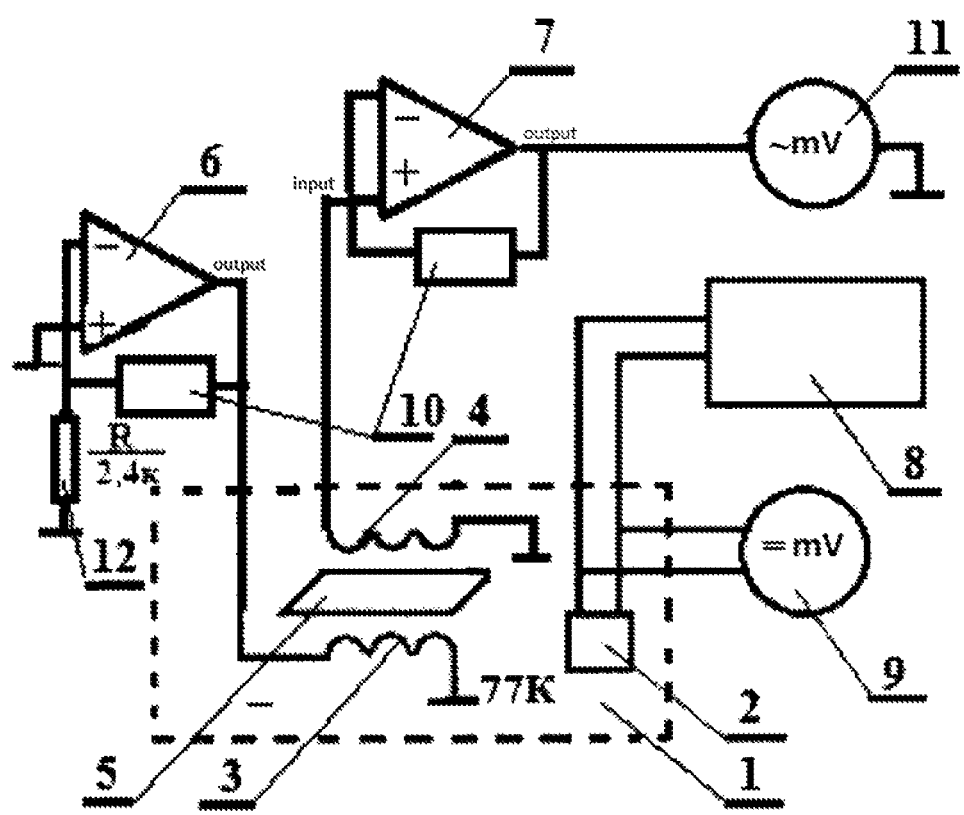
FIG. 1 shows an electric circuit of the device for controlling the parameters of strip-type superconductors.

A system for (determining) controlling the parameters of strip-type superconductors comprises a reservoir with a cryogenic agent 1, wherein a temperature sensor 2 and two inductance coils 3 and 4 are arranged with a gap between the sane for accommodating a superconductor 5. One of the coils is connected to a generator 6 and the other one to a receiver 7. The inductance coils are configured to have identical electrical parameters and are arranged at a distance of 50 mm above the cryogenic agent surface. A thermistor connected to a current stabilizer 8 and to a millivoltmeter 9 is used as a temperature sensor in contact with the superconductor. Identical electronic devices provided with feedback circuits having narrow-band suppression/transmission filters 10 with identical electrical characteristics are used as the generator and receiver amplifiers, wherein the primary inductance coil is connected to the generator output and the secondary inductance coil is connected to the receiver input. The receiver output is connected to a millivoltmeter 11.

In the proposed device, the current stabilizer may be based on a precision stabilitron having the stabilization accuracy of ±0.001 and a source follower in the anode circuit.

The electronic device used as a generator are advantageously have its inputs earthed, wherein the inverting input is further provided with a resistor 12 to limit the output voltage amplitude.

The proposed device has been tested for controlling the parameters of a strip-type high-temperature superconductor of 3 cm in length, 4 mm in width and 0.1 mm in thickness. The superconductor 5 was configured as a stainless steel substrate ribbon with two buffer layers ($9ZrO_2xY_2O_3$ and $CeO_2$) and a superconducting layer of $YBa_2Cu_3O_7$ applied thereon. The superconductor was placed between the two inductance coils 3 and 4. Each coils had an active resistance of 90 Ohm. ICL7650SCPD microcircuit was used as amplifiers of the generator 6 and receiver 7. The generator 6 and the receiver 7 were provided with feedback circuits having narrow-band suppression filters 10 each composed of three resistors and three condensers. The filter elements had a spread of ratings of ±0.03%. The inductance coils 3 and 4 and the superconductor 5 were placed in a reservoir with a cryogenic agent 1 at distance of 50 from the liquid nitrogen surface. It is advantageously to arrange the superconductor at a distance of 30 to 60 mm above the liquid nitrogen surface. CX-1080-SD thermistor 2 was used as a temperature sensor in contact with superconductor 5 surface. The thermistor resistance was determined by means of the DC millivoltmeter 9 and the thermistor stabilizer 8.

The electronic device used as the generator 6 amplifier had its inputs earthed, wherein the inverting input was further provided with the resistor 12 to control the output voltage amplitude, and had its output connected to the primary coil 3. The electronic device used as the receiver amplifier had its inverting input connected to the output via the filter 10 and its non-inverting input connected to the secondary coil 4.

Figure 2:
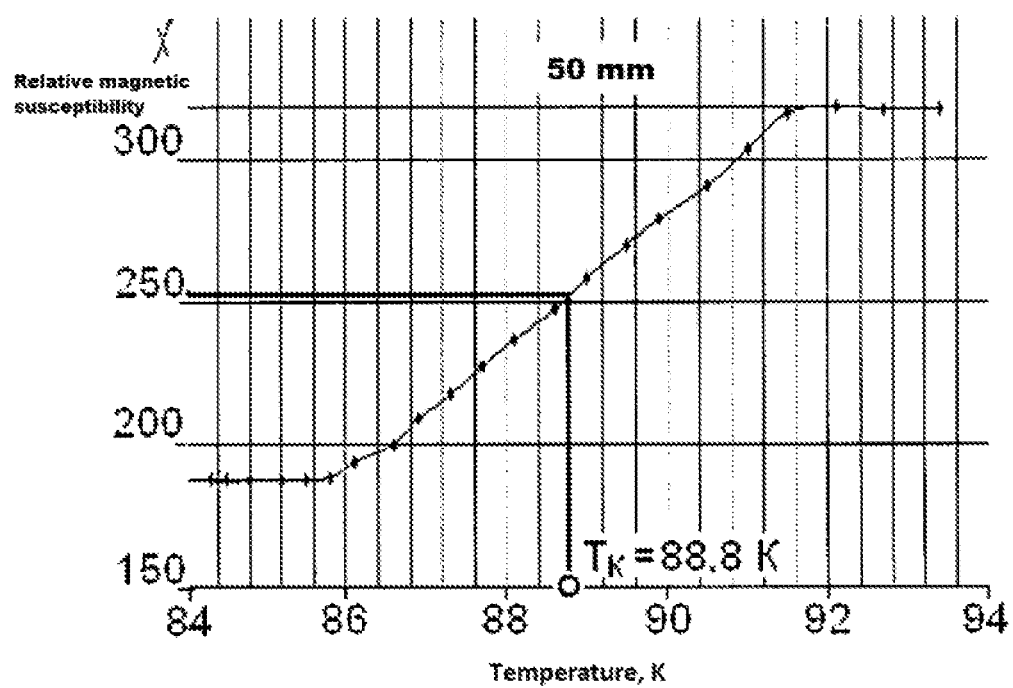
FIG. 2 shows a relationship between magnetic susceptibility and temperature of a superconductor.

Voltage of about 100 mV was applied to the primary coil 3 by the generator 6. As the device was operated, the sample cooled down and turned into superconducting state. Voltage at the secondary coil 4 (of about 3 mV) dropped sharply by approximately 80%. Voltage was applied to the amplifier 7 and recorded by the millivoltmeter 11. Magnetic susceptibility of the superconductor was determined according to the voltage value. The superconductor 5 temperature was concurrently recorded by the thermistor 2 in contact with its surface. In case of a change in the superconductor temperature, the thermistor resistance would change. The thermistor 2 current was set and maintained constant by the current stabilizer 8, and the voltage drop at the thermistor was recorded by the millivoltmeter 9. In this way, the thermistor resistance and, hence, the superconductor 5 temperature was determined. A relationship between magnetic susceptibility and the superconductor temperature is shown in FIG. 2. The presented relationship allows the superconducting transition temperature and width to be determined. Based on the analysis of said relationship, it can be concluded that the measurement accuracy of superconducting transition parameters is ±0.1 K. It has been found out by means of analyzing the results of a set of measurements that the reproducibility of measurements is also ±0.1 K.

The proposed device and system have been used for developing the process and industrial production of superconductors and allow operational control and high measurement accuracy of the temperature of various type of superconductors to be enabled concurrently.

The invention claimed is:

1. A device for determining the parameters of strip-type superconductors, comprising:
    a generator, a generator frequency-setting element and an inductance coil connected to the generator, and
    a receiver, a receiver frequency-setting element and an inductance coil connected to the receiver,
    a reservoir with a cryogenic agent and temperature measurement device used as a thermistor,
    wherein the generator and receiver inductance coils are arranged with a gap between the same, making it possible for a strip-type superconductor to be placed between the inductance coils,
    the pass/stop bands of the generator and receiver frequency-setting elements coincide through not less than at least half of the pass/stop bands of the frequency-setting element having a narrower pass/stop band width.

2. The device according to claim 1, wherein the inductance coils of the device for determining the parameters of strip-type superconductors and the temperature sensor are arranged in the reservoir with the cryogenic agent.

3. The device according to claim 1 or 2, wherein the inductance coils are arranged at a distance of at least 30 mm above the cryogenic agent surface.

4. The device according to claim 1, wherein the band centers of the pass/stop bands of the generator and receiver frequency-setting elements are frequency spaced by a value in the range of 1% to 10% or in the range of 0.5% to 1% of the pass/stop band width of the frequency-setting element having a narrower pass band width.

5. The device according to claim 1, wherein the generator and receiver frequency-setting elements have characteristics differing by a value in the relative range of 1% to 10% or in the perfect range of 0.5% to 1%.

* * * * *